United States Patent [19]

Itoh et al.

[11] Patent Number: 5,580,615
[45] Date of Patent: Dec. 3, 1996

[54] METHOD OF FORMING A CONDUCTIVE FILM ON AN INSULATING REGION OF A SUBSTRATE

[75] Inventors: Hitoshi Itoh, Mitaka; Takahiko Moriya, Yokosuka, both, Japan

[73] Assignee: Kabushiki Kaisha Toshiba, Kawasaki, Japan

[21] Appl. No.: 224,179

[22] Filed: Apr. 7, 1994

Related U.S. Application Data

[63] Continuation of Ser. No. 858,439, Mar. 24, 1992, abandoned, which is a continuation of Ser. No. 311,393, Feb. 16, 1989, abandoned, which is a continuation of Ser. No. 851,289, Apr. 10, 1986, abandoned, which is a continuation of Ser. No. 681,651, Dec. 14, 1984, abandoned.

[30] Foreign Application Priority Data

Dec. 27, 1983 [JP] Japan ................................ 58-246319

[51] Int. Cl.$^6$ ................................................ B05D 3/00
[52] U.S. Cl. ................ 427/552; 156/643.1; 204/192.34; 427/124; 427/253; 427/258; 427/264; 427/282; 427/294; 427/397.7; 427/555; 437/173; 437/228; 437/238; 437/241; 437/245
[58] Field of Search ..................... 427/552, 124, 427/258, 264, 282, 294, 253, 397.7, 555; 204/192.34; 156/643; 437/173, 228, 238, 241, 245

[56] References Cited

U.S. PATENT DOCUMENTS 4,633,035  12/1986  McMonagle ........................... 427/97
4,663,826   5/1987  Baeuerle ............................. 427/53.1

OTHER PUBLICATIONS

Draft of the 3rd International Conference of Chemical Vapor (no date).
Deposition, pp. 270–291, 1972; Jerome J. Cnomo. (No month avail).
RCA Review, pp. 306–316, Jun. 1970; J. W. Shaw and J. A. Amick.
International Electron Devices Meeting 1983, Washington D.C., US, 5th–7th December 1983, pp. 550–553, IEEE, New York, US; T. Moriya et al.: "A planar metallization process—its application to tri–level aluminum interconnection".
Applied Physics Letters, vol. 43, No. 10, 15th Nov. 1983 pp. 946–948, American Institute of Physics, New York, US; B. M. McWilliams et. al.: "Wafer–scale laser pantography: Fabrication of n–metal–oxide–semiconductor transistors and samll–scale integrated circuits by . . . ".
Applied Physics Letters, vol. 43, No. 5, 1st Sep. 1983, pp. 454–456, American Institute of Physics, New York, US R. Solanki et al.: "Photodeposition of aluminum oxide and aluminum thin films".

*Primary Examiner*—Bernard Pianalto
*Attorney, Agent, or Firm*—Oblon, Spivak, McClelland, Maier & Neustadt, P.C.

[57] ABSTRACT

A method of forming a conductive film on an insulating region of a substrate wherein a surface of the insulating region formed on the substrate is activated by irradiating the surface with electrons, ions or light. Next, a metal film pattern constituting, for example, an electrical interconnection, is deposited on the surface by applying a selective chemical vapor deposition process using a metal halide gas.

19 Claims, 2 Drawing Sheets

METHOD OF FORMING A CONDUCTIVE FILM ON AN INSULATING REGION OF A SUBSTRATE

This application is a Continuation of application Ser. No. 07/858,439, filed on Mar. 24, 1992, now abandoned, which was a Continuation of application Ser. No. 07/311,393, filed on Feb. 16, 1989, abandoned, which was a Continuation of application Ser. No. 06/851,289, filed on Apr. 10, 1986, abandoned, which was a Continuation of application Ser. No. 06/681,651, filed on Dec. 14, 1984, abandoned.

BACKGROUND OF THE INVENTION

1. Field of the Invention

This invention relates to a method of forming a conductive film on a surface of an insulating region of a substrate, which method is suitable to, for example, producing an interconnection of a semiconductor device.

2. Description of the Prior Art

In a conventional method of manufacturing an integrated circuit, the following steps are ordinarilly performed to form an electrical interconnection.

First, an insulating film of $SiO_2$ provided with a contact hole is formed on a silicon substrate having an element region such as an impurity-diffused layer. Secondly, a thin aluminum film, is deposited on the entire overall surface of the insulating film using a sputter-deposition technique. A photo-resist is coated on the thin aluminum film. Then, a patterned mask is arranged facing the photo-resist layer and separated therefrom by a predetermined distance. A light beam is irradiated on the photoresist layer through the patterned mask, and the photo-resist layer is selectively exposed. Then, unnecessary parts of the photo-resist layer are removed, and part of the aluminum film is exposed. The exposed part of the aluminum film is removed by sputter-etching, etc., using the remaining resist layer as an etching mask. The resist layer is removed, and the interconnecting process ends.

In the above method, the number of manufacturing steps is large to form only one layer interconnection. Therefore, the manufacturing yield is low, and the manufacturing time is long. Especially, the problem of long manufacturing time is serious in producing an integrated circuit such as the so-called GATE ARRAY, where the interconnections are personalized after receiving a client's order. In addition, the conventional method exhibits poor reproducibility of the interconnections, due to the complicated effects of inaccuracies during exposing and etching.

For this reason, a design tolerance for interconnecting accuracy is required, which makes it difficult to attain a high density integrated circuit.

Another method of forming an electrical interconnection is known from Japanese Patent Publication (KOKAI) No. 52-40969. In this known method, a selective chemical vapor deposition process is adopted to form the interconnection. The steps of this method include forming a silicondioxide film with a contact hall on a silicon substrate, and then applying a selective chemical vapor deposition process. In the process, a gas such as $M_0F_6$ or $WF_6$ and a hydrogen gas are introduced, while the substrate is heated. Thereby, a molybdenum or tungsten layer is deposited on exposed part of the substrate surrounded by the contact hall, but is not deposited on the silicon-dioxide film. Then, in order to lead out the molybdenum or tungsten layer, an aluminum interconnection pattern is essentially formed on the silicon-dioxide film. According to this above method, the number of manufacturing steps is large, and the reproducibility and yield are bad. This is because the step of forming the aluminum interconnection pattern is essential, which complicates the manufacturing of an integrated circuit, etc.

SUMMARY OF THE INVENTION

Accordingly, one object of this invention is to provide a new and improved method of forming accurately a conductive film pattern.

Another object of this invention is to provide a new and improved method of forming a conductive film with a high reproducibility.

A further object of this invention is to provide a novel high yield method of forming a conductive film.

These and other objects are achieved according to the invention by providing a novel method of forming a conductive film including the steps of activating a surface of an insulating region of a substrate and depositing the conductive film on the surface of the insulating region by a selective chemical vapor deposition process.

According to the invention, the activation should be, for example, a physical and/or chemical treatment of the surface of the insulating region.

According to a preferred embodiment of the invention, the conductive film is a refractory metal film, preferably deposited under the conditions that the substrate temperature is 200° to 700° C., the refractory metal halide gas flow rate is 1 to 20 ml/minute, the hydrogen gas flow rate is 10 to 1000 ml/minute, and the pressure is at or below 5 torr.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
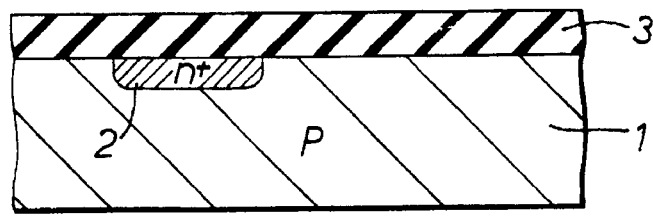
FIGS. 1(a), 1(b) and 1(c) are cross-sectional views of a substrate in each step of an embodiment of the method of the invention.
Figure 1B:
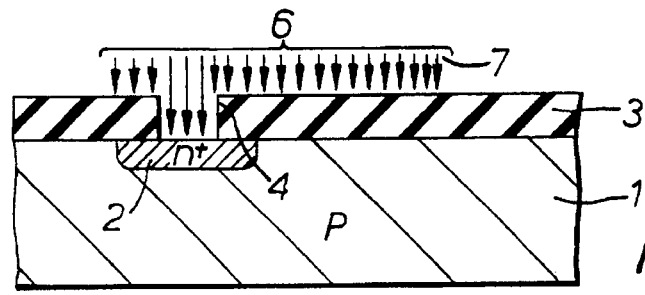
Figure 1C:
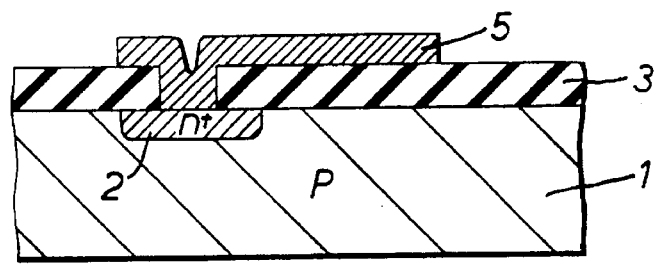

Referring now to the drawings, wherein like reference numerals designate identical or corresponding parts throughout the several views, FIGS. 1(a) to (c) are cross-sectional views of a substrate in each step of a first embodiment of the invention.

First, in FIG. 1(a), an element region 2 such as a diffusion layer is formed on a P-type silicon substrate 1. Subsequently, an insulating film 3 of silicon dioxide is formed on the entire surface of substrate 1 by a thermal oxidation.

Next, as shown in FIG. 1(b), a contact hole 4 is formed in insulating film 3 by etching. Then, a predetermined region 6 for an interconnection is irradiated and scanned by an electron beam 7 using such an electron beam drawing apparatus, as disclosed, for example, in U.S. Pat. No. 4,063,103. As a result, the surface of region 6 is selectively activated, such that at least part of the atomic bonds of the constituent molecules irradiated in the region 6 is cut, and thereby the constituent molecules of the region 6 change into a state capable of readily combining with other atoms. In the irradiation step, the electron beam radiation is peformed at an acceleration voltage of 50 keV and a dose value of $3\times10^{14}$ cm$^{-2}$.

Figure 2:
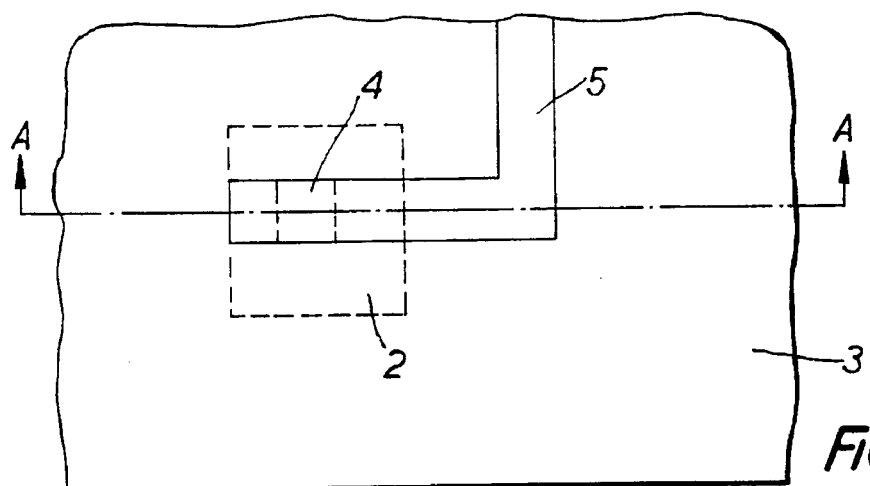
FIG. 2 is a plane view of the substrate shown in FIG. 1(c)

Then, a thin tungsten film 5 of 3000 Å is selectively formed only on the region 6 treated by the electron beam as shown in FIG. 1(c) and FIG. 2. FIG. 1(c) is a cross-sectional view taken along the line A—A of FIG. 2. The selective forming of tungsten film 5 is performed by a low pressure chemical vapor deposition process (LPCVD process) using a WF$_6$ gas and a hydrogen gas under the following conditions. The substrate temperature is 350° C. The WF$_6$ gas flow rate is 1 ml/minute, and the hydrogen gas flow rate is 200 ml/minute. The atmosphere pressure around the substrate 1 is 0.06 torr. The deposition is performed for 80 minutes. The tungsten film 5 is deposited mainly by a reducing reaction of hydrogen to WF$_6$. According to aforementioned steps, the interconnection is completed.

The embodiment above-described exhibits the following advantages.

(1) No mask alignment step is necessary to project an interconnection pattern onto a resist through a photo-mask, and therefore a highly accurate interconnection is obtained.

(2) The interconnecting process is simplified in comparison with the conventional process, which contributes to high yield.

(3) An accurate film pattern can be formed. Thus, for example, an electron beam drawing accuracy to be measured for a mask manufacturing, can be inspected by observing the film pattern using a scanning electron beam microscope.

(4) The pattern reproducibility is high and damage to tungsten film 5 is small in the interconnecting process. These advantages are not attained in the conventional method, wherein a resist film and a metal film are patterned by photo-exposing and etching after these films are formed on an entire surface of an insulated substrate.

(5) electrical defects caused by the so-called Hilock phenomenon and electromigration in the interconnection film 5 decreases by using refractory metal instead of aluminum.

Another embodiment of the invention will be explained by reference to FIG. 3, which is applied to a method for manufacturing an integrated circuit. First, an element region 12 such as a diffusion layer is formed on a P-type silicon substrate 11. Subsequently, an insulating film 13 of silicon-dioxide of 5000 Å is formed on the surface of substrate 11, and a contact hole 14 is formed in the insulating film 13 (FIG. 3(a)). A photo-resist 18 is coated on the entire surface of insulating film 13. The position of substrate 11 is aligned to that of a photo-projecting mask (not shown). A light beam is projected through the mask to photo-resist 18, which is exposed according to an interconnection pattern. The exposed part of photo-resist 18, corresponding to an area 16 to be interconnected, is removed by an etching solution. Then, the surface of insulating film 13 corresponding to area 16 is selectively and slightly etched and activated (FIG. 3(b)). This etching is done by accelerated argon ions 17 in a sputter-etching process using the remaining photo-resist 18 as a mask. The gas pressure around the substrate 11 is, for example, 1 torr, and the power to be applied is, for example, 1.5 kw with 100 volts.

Subsequently, photo-resist 18 is removed as a whole, and then the surface of insulating film 13 is cleaned by a diluted HF solution (H$_2$O:HF=100:1). This cleaning suppresses activation of the surface of insulating film 13 beneath the photo-resist (FIG. 3(b)). Next, a thin tungsten film 15 of 1 μm is formed on area 16 of the surface of insulating film 13, under the same conditions as those of the selective low pressure chemical vapor deposition of the first aforementioned embodiment of the invention. In other words, the interconnection of tungsten film 15 is restrictively formed only on the sputter-etched region of insulating film 13. According to the above steps, the interconnection is completed.

In this embodiment the pattern accuracy, reproductivity and yield of the tungsten film is also high.

In the above embodiment, the tungsten interconnection film 15 is projected from the surface of insulating film 13. But, by etching a groove of a large depth in the step of FIG. 3(b), tungsten film 15 may be buried in the groove.

Figure 4:
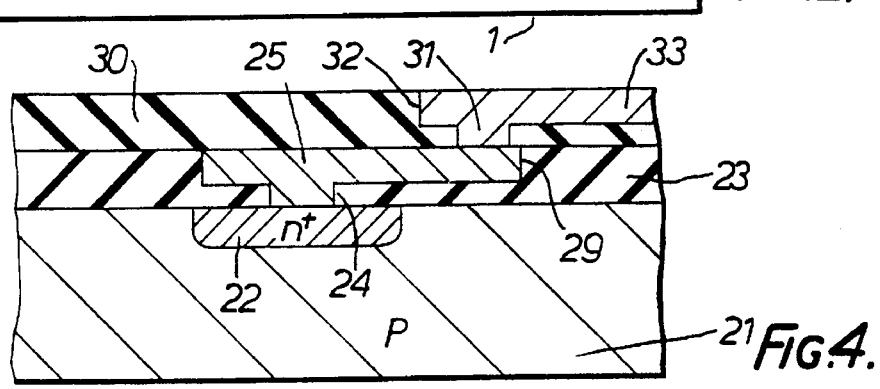
FIG. 4 is a cross-sectional view of an integrated circuit having a multi-layer interconnection structure produced according to yet another embodiment of the method of the invention.
Figure 3A:
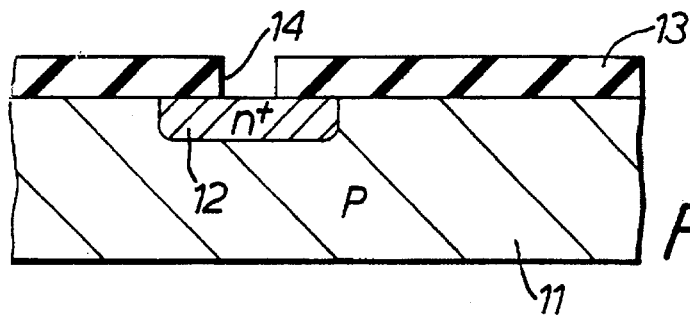
FIGS. 3(a), 3(b), 3(c) and 3(d) are cross-sectional views of a substrate in each step of another embodiment of the method of the invention.
Figure 3B:
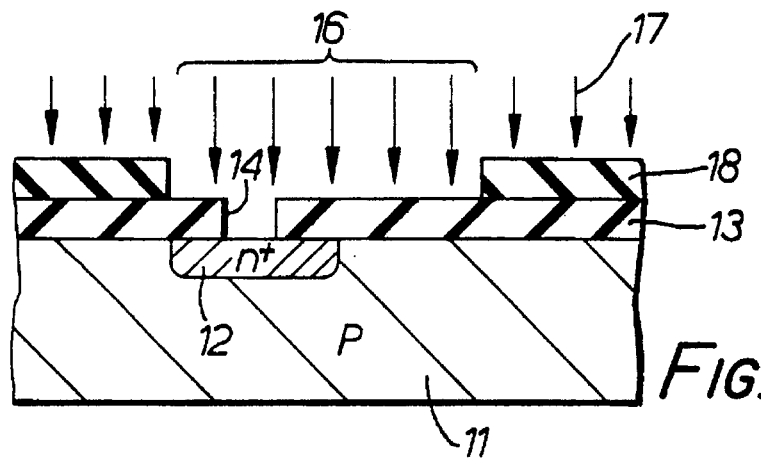
Figure 3C:
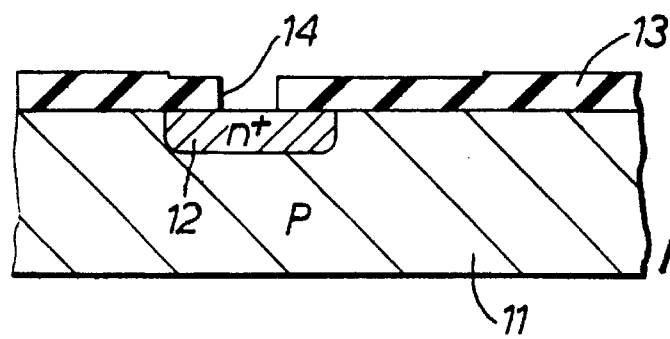
Figure 3D:
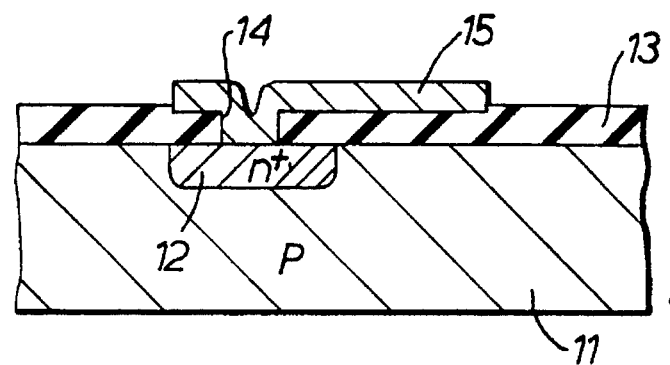

FIG. 4 shows an example of a multi-layer interconnection integrated circuit made according to the above modified method. An insulating film 23 of thermally formed silicon-dioxide with a contact hole 24 is formed on a P-type silicon substrate 21 having an N-type element region 22 formed therein. Subsequently, a groove 29 is formed in insulating film 23 in accordance with a predetermined interconnection pattern by a reactive ion etching using CF$_4$ and H$_2$ gases. Then, a tungsten film 25 is buried in groove 29 by a selective chemical vapor deposition. An insulating film 30 of silicon-dioxide is formed by a chemical vapor deposition and is etched to form a contact hole 31. Furthermore, insulating film 30 is engraved by a reactive ion etching using CF$_4$ and H$_2$ gases, in order to form a groove 32. A thin tungsten interconnection film 33 is buried in groove 32 by a selective chemical vapor deposition.

The integrated circuit manufactured according to the above method has good surface flatness at the surface constituted by insulating film 23 and tungsten film 25. In addition, disconnection of tungsten interconnection film 33 is suppressed from happening, and the lithography accuracy is high.

According to the aforementioned embodiments of the invention, electron beam radiation, ion-sputtering or reactive ion etching is adopted to activate the surface of the insulating film. Other activation techniques, e.g., laser radiation, chemical dry etching or wet treatment by an acid or base, can also be adopted. By the laser radiation, the surface of the insulating film is excited so that the surface changes into a state capable of readily combining with other atoms.

As an interconnecting material, a refractory metal such as molybdenum, titanium, tantalum or a metal such as aluminum, platinum, or copper may be used as well as tungsten in the above-described embodiments.

For selective chemical vapor deposition, various metal halide gases may be used instead of the tungsten fluoride gas used in the above-described embodiments. When a refractory metal halide gas is used in the selective chemical vapor deposition, the preferable deposition conditions are that the substrate temperature is 200° to 700° C., the refractory metal halide gas flow rate is 1 to 20 ml/minute, the hydrogen gas flow rate is 10 to 1000 ml/minute, and the pressure around the substrate is at or below 5 torr.

The substrate may be an insulator body, which is different from those of the above described embodiments.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of forming conductive film on an insulating region of a semiconductor substrate, said substrate being formed so as to have a first conductivity type, comprising the steps of:

forming an insulating region on a semiconductor substrate, said insulating region having an opening above a semiconductor region formed at the surface of said semiconductor substrate and wherein said semiconductor region has a doping so as to have conductivity type which is opposite to that of said semiconductor substrate thereby defining a second conductivity type;

activating by radiating charged particles onto said semiconductor region in said opening and a part of a surface of said insulating region which is adjacent to said opening; and exposing said substrate to a decompressed circumstance, said circumstance involving heating in the presence of a metal halide and hydrogen gas, such that a conductive film is selectively and continuously formed on an upper surface of said insulating region and said semiconductor region both of which are activated by said step of activating.

2. The method according to claim 1, wherein said activating step comprises:

radiating an electron beam on the surface of the insulating region.

3. The method according to claim 1, wherein said activating step comprises:

sputter etching of the surface of the insulating region.

4. The method according to claim 1, wherein said activating step comprises:

reactive ion etching of the surface of the insulating region.

5. The method according to claim 1, wherein said activating step comprises:

chemical dry etching the surface of the insulating region.

6. The method according to claim 1, wherein said activating step comprises:

wet treatment of the surface of the insulating region.

7. The method according to claim 1, wherein said insulating region is a silicon dioxide film.

8. The method according to claim 1, wherein said decompressed circumstance occurs at a pressure at or below 5 torr and heating said substrate to a temperature of 200°–700° C.

9. The method according to claim 1, wherein said exposing step further comprises:

heating said substrate to a temperature of 200°–700° C., employing a metal halide gas flow rate of 1–20 ml/minute, employing hydrogen flow rate of 10–1000 ml/minute, and maintaining said substrate at a pressure at or below 5 torr.

10. The method according to claim 1, said activating step comprising:

etching said insulating region to form a groove therein.

11. The method according to claim 10, wherein said groove formed by said etching is buried with said conductive film.

12. The method according to claim 1, wherein said activating step comprising:

masking said insulating region using a mask provided on the insulating region.

13. The method according to claim 12, wherein said activating step comprises:

a non-activating treatment applied to a part of the insulating region beneath the mask after removal of the mask and before the exposing step.

14. A method of forming a conductive film on an insulating region of a substrate, comprising the steps of:

activating a part of a surface of said insulating region by way of laser radiation to excite the surface of said insulating region; and exposing said substrate and said insulating region to a decompressed circumstance, after said activating step, said circumstance involving heating in the presence of a metal halide and hydrogen gas, whereby a conductive film is selectively grown on said part of the surface of the insulating region activated in the activating step.

15. The method according to claim 14, wherein said insulating region is a silicon dioxide film.

16. The method according to claim 14, wherein said insulating region is formed on a semiconductor substrate, said insulating region has an opening corresponding to a semiconductor region formed at the surface of said semiconductor substrate, said semiconductor region is doped so as to have the opposite conductivity type as that of said semiconductor substrate, and a conductive film is formed continuously on said semiconductor region in said opening to said insulating region.

17. The method according to claim 14, wherein said circumstance comprising a pressure at or below 5 torr and heating said substrate to a temperature of 200°–700° C.

18. The method according to claim 14, wherein said exposing step comprises:

heating said substrate to a temperature of 200°–700° C., employing a metal halide gas flow rate of 1–20 ml/minute, employing hydrogen flow rate of 10–1000 ml/minute, and maintaining said substrate at a pressure at or below 5 torr.

19. A method of forming conductive film on an insulating region of a semiconductor substrate, comprising the steps of:

forming an insulating region on a semiconductor substrate, said insulating region having an opening which functions as a contact hole;

activating by radiating charged particles onto said opening and to a part of a surface of said insulating region which is adjacent to said opening; and exposing said substrate to a decompressed circumstances, said circumstance involving heating in the presence of a metal halide and hydrogen gas, such that a conductive film is selectively and continuously formed on the activated upper surface of said insulating region and in said opening.

* * * * *